(12) United States Patent
Yang et al.

(10) Patent No.: US 11,558,979 B2
(45) Date of Patent: Jan. 17, 2023

(54) HEAT SINK FOR ELECTRONIC DEVICES

(71) Applicant: DUPONT ELECTRONICS, INC., Wilmington, DE (US)

(72) Inventors: Tao Yang, Shanghai (CN); Ping Wang, Shanghai (CN); Chong Yang Wang, Shanghai (CN); Da Liang Ju, Shanghai (CN); Zheyue Yang, Shanghai (CN)

(73) Assignee: DUPONT ELECTRONICS, INC., Wilmington, DE (US)

( * ) Notice: Subject to any disclaimer, the term of this patent is extended or adjusted under 35 U.S.C. 154(b) by 63 days.

(21) Appl. No.: 17/348,350

(22) Filed: Jun. 15, 2021

(65) Prior Publication Data
US 2022/0030738 A1 Jan. 27, 2022

(30) Foreign Application Priority Data

Jul. 27, 2020 (CN) .......................... 202010731057.4

(51) Int. Cl.
*H05K 7/20* (2006.01)
(52) U.S. Cl.
CPC .................................. *H05K 7/2039* (2013.01)
(58) Field of Classification Search
CPC ............. H01L 23/3737; H01L 23/3677; H01L 23/3672; H01L 23/3675; H01L 23/3733; H01L 23/3735; H05K 7/2039; H05K 2201/0129; H05K 2201/0209
See application file for complete search history.

(56) References Cited

U.S. PATENT DOCUMENTS

| | | | | |
|---|---|---|---|---|
| 10,240,772 | B2 * | 3/2019 | Chowdhury | ............ F21V 29/71 |
| 2007/0012429 | A1 * | 1/2007 | Siu | ........................ F28F 21/062 |
| | | | | 165/104.33 |
| 2008/0241488 | A1 * | 10/2008 | Ohta | ................... H01L 23/3737 |
| | | | | 156/60 |
| 2008/0282542 | A1 * | 11/2008 | McCutcheon | ...... H01L 23/3735 |
| | | | | 257/E23.105 |
| 2012/0234519 | A1 * | 9/2012 | Lee | ..................... H01L 23/3677 |
| | | | | 165/185 |
| 2012/0307501 | A1 | 12/2012 | Tankala et al. | |
| 2019/0019739 | A1 * | 1/2019 | Kanaya | ................. B32B 27/283 |
| 2020/0115286 | A1 * | 4/2020 | Pawlik | .................. C04B 35/632 |

FOREIGN PATENT DOCUMENTS

JP 2014/093427 A 5/2014

* cited by examiner

*Primary Examiner* — Adam B Dravininkas (57) ABSTRACT

The present invention discloses heat sinks comprising a base and a plurality of fins protruding from one surface of the base, wherein the base and the fins are independently composed of one or more anisotropic thermal conductive films. Said anisotropic thermal conductive film is electric insulative with low Dk and Df values.

Also disclosed are methods for manufacturing the heat sinks and methods for dissipating heat of electronic devices having at least one heat generating component.

20 Claims, 9 Drawing Sheets

HEAT SINK FOR ELECTRONIC DEVICES

TECHNICAL FIELD

The present invention relates to a heat sink for dissipating heat of an electronic device, which is composed of anisotropic thermal conductive films.

BACKGROUND

Heat sinks are commonly used to increase the convective surface area of a heat generating device to improve heat dissipation. Conventional heat sinks are usually made of high thermal conductivity metals, especially aluminum and copper. These metallic heat sinks are efficiently in heat dissipation, but still have drawbacks that limit their uses. One inherent problem is the electrically conductivity that makes the metallic heat sinks not suitable for electronic devices having high voltages or exposed circuits. In addition, the metallic heat sinks may interfere with electromagnetic signal and/or energy transmission to influence the operation of some communication devices. Furthermore, the trend of electronic devices with lighter weight also limits the applications of metallic heat sinks.

Thermal conductive polymer composites are good alternatives to replace metals used in the heat sinks due to their low cost, light weight, moldable, flexible, corrosion resistant, non-reactive stability, and electrically insulating nature. For example, S. Ito et al in JP2014/093427, discloses a heat sink containing a molded body made from a thermoplastic resin composition containing (A) a thermoplastic resin, (B) a filler having a thermal conductivity of 5 W/m K or more, and (C) rosin. As shown in Table 1 of JP2014/093427, the loading of graphite in polyamide resin (PA6) must increase from 33 wt % (Ex. 5) to 57 wt % (Ex. 8) to obtain the composite with a thermal conductivity raised from 5 W/m·K to 28 W/m·K.

T. C. Tankala et al in US2012/0307501 A1, a plastic heat sink system composed of 35-80 vol % of a thermoplastic polymer and a combination of fillers having high or low thermal conductivities and electrical resistivities including ZnS, CaO, MgO, ZnO, $TiO_2$; AlN, BN, $MgSiN_2$, SiC, ceramic-coated graphite; graphite, expanded graphite, graphene, carbon fibers, carbon nanotubes (CNT), and graphitized carbon black.

However, the commercially available thermal conductive polymers generally have a thermal conductivity of about 5 W/m·K Polymer composites exhibiting a thermal conductivity higher than 5 W/m·K may have a high thermal conductive filler loading of at least 30 weight %, that usually compromise the advantages of the polymer composites, for example higher density, deteriorated mechanical properties, and increased difficulties in moldability and processability.

SUMMARY

The present invention provides a heat sink for an electronic device, comprising a base and a plurality of fins protruding from one surface of the base, wherein
  the base has a length (L1) ranging from 5 mm to 300 mm, a width (W1) ranging from 5 mm to 300 mm, and a thickness (H1) ranging from 0.03 mm to 200 mm;
  each fin has a thickness (L2) of less than 2.0 mm, a width (W2) ranging from 0.5 to 2.0 times that of W1, and a protruding height (H2) of at least 3 mm;
  the average number of fins is in a range of from 0.5 to 10 per 10 mm of the base's length;
  the base is composed of one or more first polymeric films;
  each fin is composed of one or more second polymeric films; and
  the first polymeric films and the second polymeric films are anisotropic thermal conductive films, each independently has a volume resistivity of more than $10^{15}$ Ω·cm; an in-plane thermal conductivity in one direction higher than that of the orthogonal direction, and said higher thermal conductivity ranges from 10 to 100 W/m·K; a dielectric constant (Dk) of 4 or less at 30 GHz; and a dissipation factor (Df) of 0.001 or less at 30 GHz;
  provided that the first polymeric film and the second polymeric film are free of fillers having a thermal conductivity of 5 W/m·K or more.

In one embodiment of the present heat sink, the first polymeric film and the second polymeric film each independently has a crystallinity of at least 75%.

In another embodiment of the present heat sink, the first polymeric film and the second polymeric film are each independently composed of a polymer having an average molecular weight being at least 1,000,000.

In yet another embodiment of the present heat sink, the first polymeric film and the second polymeric film are each independently composed of a polymer selected from the group consisting of polyethylene (PE), polytetrafluoroethylene (PTFE), poly(p-phenylene benzobisoxazole) (PBO), polyhydroquinone-diimidazo-pyridine (PIPD), and poly (phenylene benzobisthiazole) (PBZT).

In still another embodiment of the present heat sink, the first polymeric film and the second polymeric film are the same.

In one embodiment of the present heat sink, the fins and the base are separated parts, and assembled together by laser soldering, gluing, inserting, stitching, or combinations thereof.

In another embodiment of the heat sink, the surface of the base is flat; uneven with a plurality of slots or slits, wherein each slot has a shape matching the connecting portion of the fin; or 3D shaped.

In yet another embodiment of the present heat sink, a portion of each fin is connected to the base; and is flat, wedged, curved, with flange, or a shape matching the 3D shaped base.

In still another embodiment of the present heat sink, each fin is a sheet of rectangle, square, circle, oval, or irregular shape.

In a further embodiment of the present heat sink, each fin is a thin board composed of multiple cells with a cross-sectional shape of triangle, square, rectangle, circle, or hexagon.

In one embodiment of the present heat sink, the fins are interconnected into a block with multiple air pathways; each air pathway has a cross-sectional shape of triangle, square, rectangle, circle, oval, or hexagon.

In another embodiment of the present heat sink, the base is formed of a plurality of the first polymeric films by laminating, thermal forming, stitching, or combinations thereof; and optionally applying an adhesive between the adjacent polymeric films.

In yet another embodiment of the present heat sink, wherein the first polymeric films are stacked with an alignment angle θ1 ranging from 0° to 90° between the adjacent polymeric films relative to the respective higher thermal conductive directions.

In a further embodiment of the present heat sink, each fin is formed of a plurality of the second polymeric films by laminating, thermal forming, stitching, or combinations thereof; and optionally applying an adhesive between the adjacent polymeric films.

In one embodiment of the present heat sink, wherein the second polymeric films are stacked with an alignment angle θ2 ranging from 0° to 90° between the adjacent polymeric films respective to their higher thermal conductive directions.

The present invention also provides methods for manufacturing the present heat sinks, methods for dissipating heat of an electronic device, and the electronic devices comprising the present heat sinks.

BRIEF DESCRIPTION OF THE DRAWINGS

FIG. 5 (A) is a perspective view showing one embodiment of the present method for manufacturing the present heat sink; (B) is a sideview of the resulting heat sink.

Skilled artisans of the field appreciate that the objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

All publications, patent applications, patents and other references mentioned herein, if not otherwise indicated, are explicitly incorporated by reference herein in their entirety for all purposes as if fully set forth. Unless otherwise defined, all technical and scientific terms used herein have the same meaning as commonly understood by one of ordinary skill in the art to which this invention belongs. In case of conflict, the present specification, including definitions, will control.

Unless stated otherwise, all percentages, parts, ratios, etc., are by weight.

As used herein, the term "produced from" is synonymous to "comprising". As used herein, the terms "comprises," "comprising," "includes," "including," "has," "having," "contains" or "containing," or any other variation thereof, are intended to cover a non-exclusive inclusion. For example, a composition, process, method, article, or apparatus that comprises a list of elements is not necessarily limited to only those elements but may include other elements not expressly listed or inherent to such composition, process, method, article, or apparatus.

The transitional phrase "consisting of" excludes any element, step, or ingredient not specified. If in the claim, such a phrase would close the claim to the inclusion of materials other than those recited except for impurities ordinarily associated therewith. When the phrase "consisting of" appears in a clause of the body of a claim, rather than immediately following the preamble, it limits only the element set forth in that clause; other elements are not excluded from the claim as a whole.

The transitional phrase "consisting essentially of" is used to define a composition, method or apparatus that includes materials, steps, features, components, or elements, in addition to those literally discussed, provided that these additional materials, steps features, components, or elements do not materially affect the basic and novel characteristic(s) of the claimed invention. The term "consisting essentially of" occupies a middle ground between "comprising" and "consisting of".

The term "comprising" is intended to include embodiments encompassed by the terms "consisting essentially of" and "consisting of". Similarly, the term "consisting essentially of" is intended to include embodiments encompassed by the term 'consisting of'.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. For example, when a range of "1 to 5" is recited, the recited range should be construed as including ranges "1 to 4", "1 to 3", "1-2", "1-2 & 4-5", "1-3 & 5", and the like. Where a range of numerical values is recited herein, unless otherwise stated, the range is intended to include the endpoints thereof, and all integers and fractions within the range.

When the term "about" is used in describing a value or an end-point of a range, the disclosure should be understood to include the specific value or end-point referred to.

Further, unless expressly stated to the contrary. "or" refers to an inclusive "or" and not to an exclusive "or". For example, a condition A "or" B is satisfied by any one of the following: A is true (or present) and B is false (or not present), A is false (or not present) and B is true (or present), and both A and B are true (or present).

As used herein, the terms "a" and "an" include the concepts of "at least one" and "one or more than one".

Many aspects and embodiments have been described above and are merely exemplary and not limiting. After reading this specification, skilled artisans appreciate that other aspects and embodiments are possible without departing from the scope of the invention. Other features and advantages of the invention will be apparent from the following detailed description, and from the claims.

Heat Sink

Figure 1:
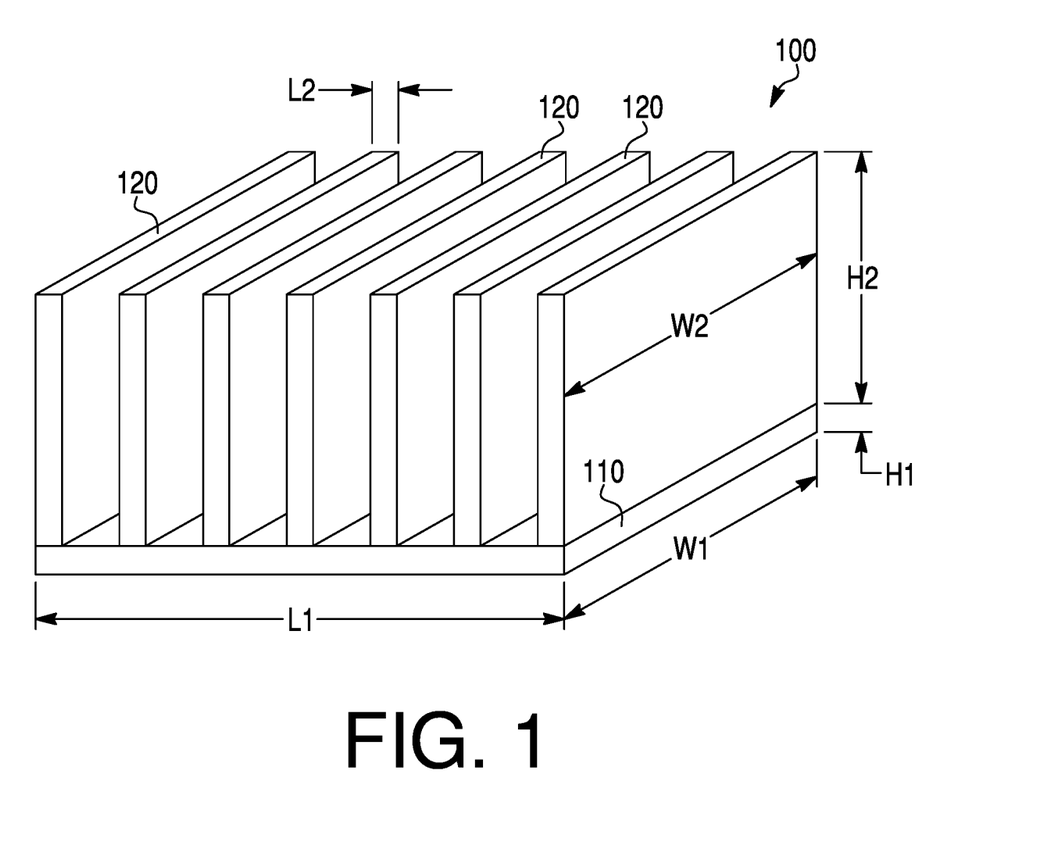
FIG. 1 is a perspective view showing one embodiment of the present invention.

Referring to FIG. 1, disclosed herein is a heat sink 100 comprising: a base 110 and a plurality of fins 120 protruding from one surface (i.e. the top surface) of the base, wherein the base has a length (L1), a width (W1), and a thickness (H1); and each fin has a thickness (L2), a width (W2), and a protruding height (H2) measured from the top surface of base.

Preferable dimensions of the base are length (L1) ranging from 5 mm to 300 mm, a width (W1) ranging from 5 mm to 300 mm, and a thickness (H1) ranging from 0.03 mm to 200 mm. Preferable dimensions of each fin are with a thickness (L2) of 2.0 mm or less, or ranging from 0.03 mm to 1.5 mm, or from 0.05 mm to 1.0 mm; a width (W2) ranging from 0.5 to 2.0 times that of W1, or from 0.7 to 1.5 times that of W1, or about the same as W1; and a protruding height (H2) of at least 3 mm, or 5 mm, or 10 mm. The number of fins is adjustable and is generally in a range of from 0.5 to 10 per 10 mm of the base's length (L1) to allow enough air flow between the fins.

Figure 2:
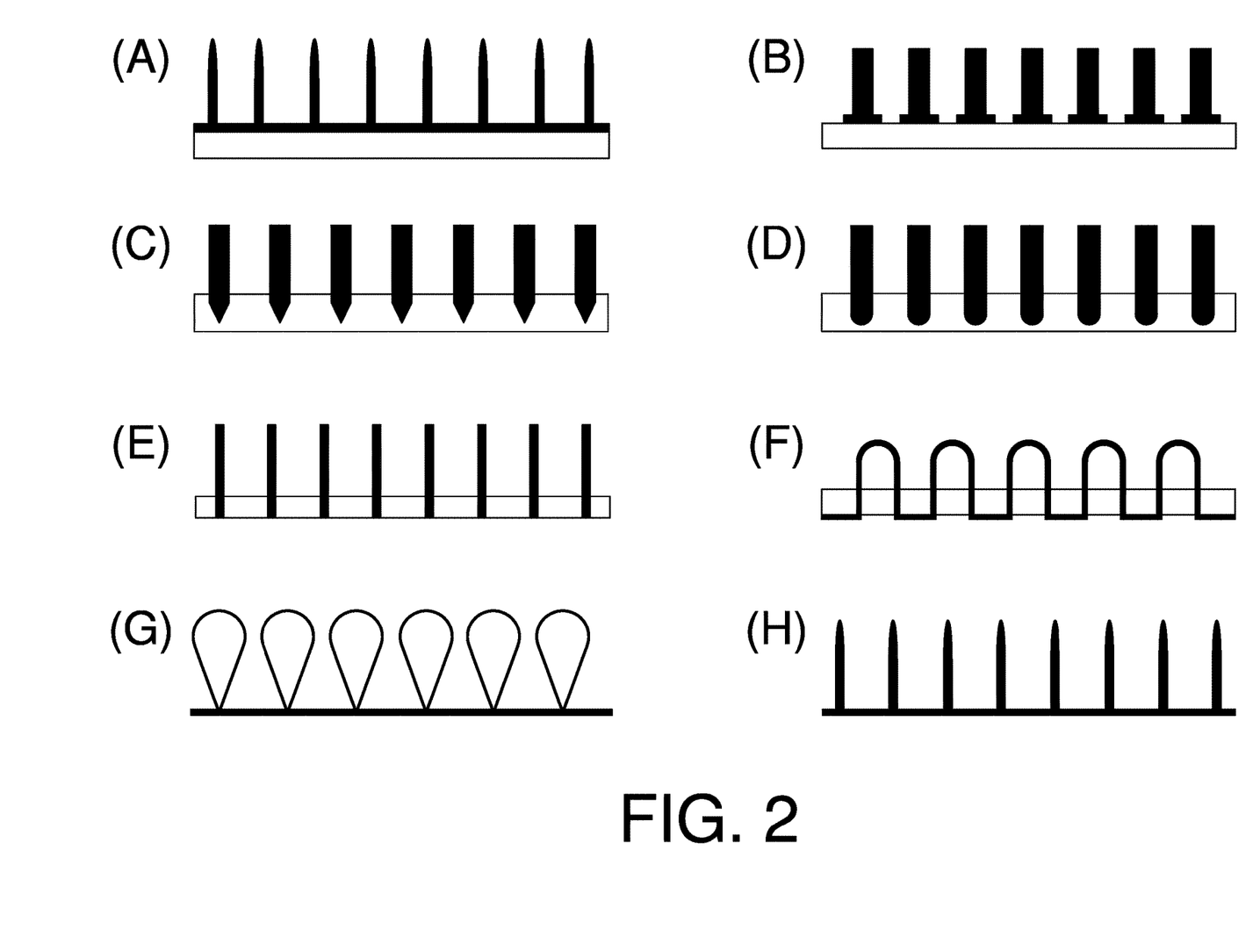
FIG. 2 is a cross-sectional view showing some embodiments of the present invention.

The heat sink of the invention may be formed by separated parts of a base and a plurality of fins, and assembled together by laser soldering, gluing, inserting, stitching, or combinations thereof. The present heat sink may have various configurations, for example, the surface of the base may be flat as shown in FIGS. 2(A) and (B); or uneven with a plurality of slots, where the slots have carved out shapes matching the connecting portions of the fins as shown in FIGS. 2(C) and (D). The connecting portions of the fins may be flat, wedged, curved, or with flange (see FIG. 2-(B)). Additionally, the base may have cut through slits as shown in FIGS. 2(E) and (F), and the fins may be formed by threading a strip of a thermal conductive film or laminate made thereof through the slits of the base (see FIG. 2(F)). Alternatively, the base and the fins may be made by folding a strip of the thermal conductive film or laminate made thereof and not attached to a separate base as long as the strip has sufficient stiffness to retain the configuration (see FIGS. 2(G) and (H)); or by cutting a laminate block composed of the thermal conductive films as shown in FIG. 5(B); or the base is 3D shaped, and the fins have a shape matching the 3D shaped base. The heat sink made by folding without a separate base may be adhered to an adhesive tape with a release film/paper. Said release film/paper may be removed when the heat sink is ready for use to allow good attachment to a heat generating component of an electronic device.

Figure 3:
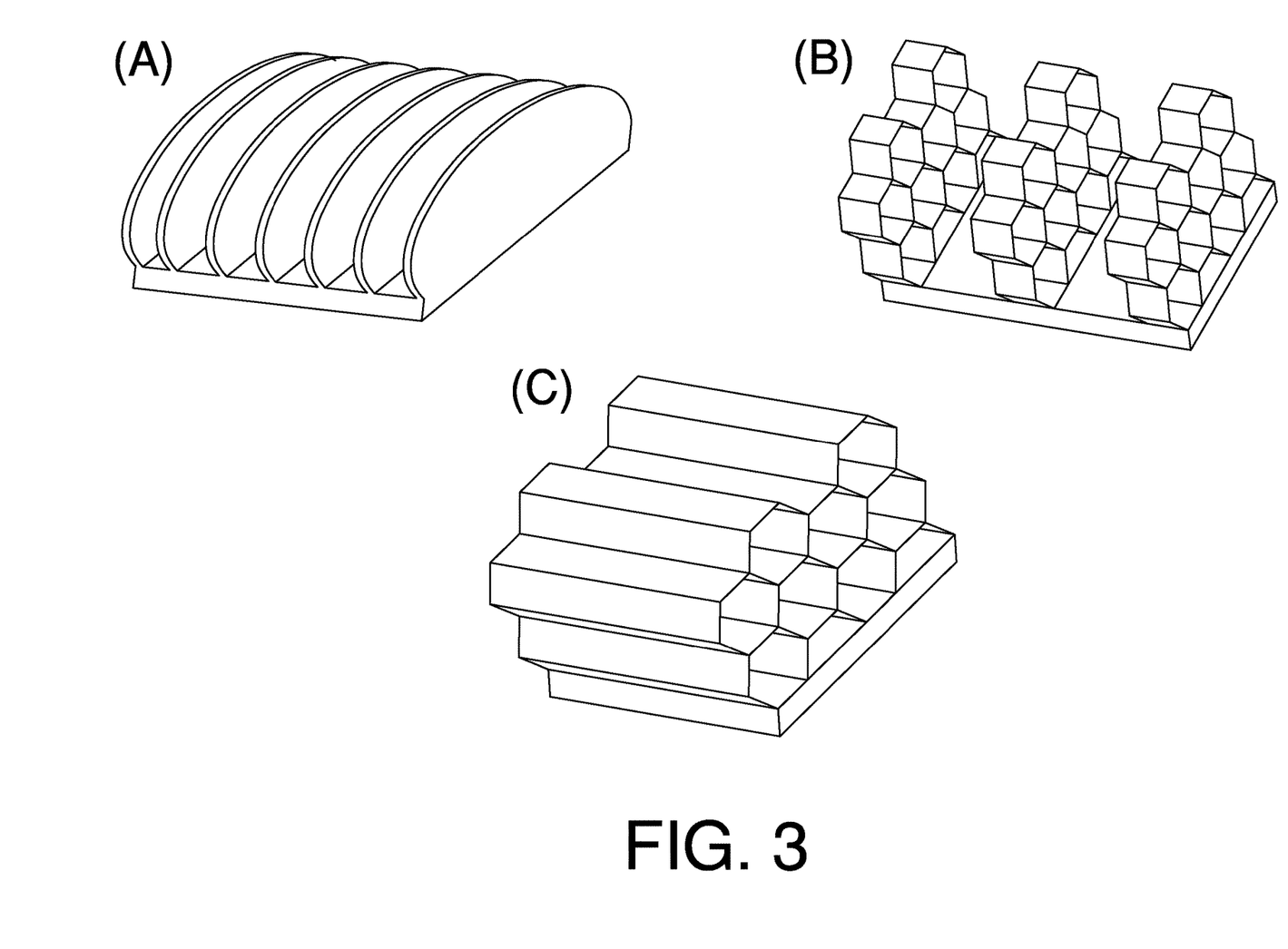
FIG. 3 is a perspective showing some embodiments of the present invention.

In the present heat sink, each fin may be a sheet of square, rectangle, circle, oval, hexagon, or irregular shape by viewing widthwise as shown in FIG. 3-(A). In the present heat sink, each fin may also be a thin board composed of multiple cells with a cross-sectional shape of triangle, square, rectangle, circle, or hexagon (FIG. 3-(B)). Furthermore, the fins may be interconnected forming a heat dissipation block with multiple air pathways along the width direction; each air pathway may have a cross-sectional shape of triangle, square, rectangle, circle, or hexagon (FIG. 3-(C)).

One skilled in the art will have no difficulty in selecting a suitable shape of the fins, and the connecting portion design according to the specific application and the space allowed for the heat sink in the electronic device.

In the present heat sink, the base is composed of at least one layer of a first polymeric film, and the fins are composed of at least one layer of a second polymeric film. Both the first polymeric film and the second polymeric film are anisotropic thermal conductive films. As used herein, the term "thermal conductive" and "thermal conductivity" may be abbreviated as "TC"; e.g., "thermal conductive film" as "TC film"; or "higher thermal conductivity direction" as "higher TC direction." Each polymeric film independently has an in-plane TC that is higher in one direction than that of the orthogonal direction. The through-plane thermal conductivity of the polymeric film is generally low, and no more than 1 W/m·K, or less than 0.5 W/m·K. Details of the first polymeric film and second polymeric film are described below.

Figure 4:
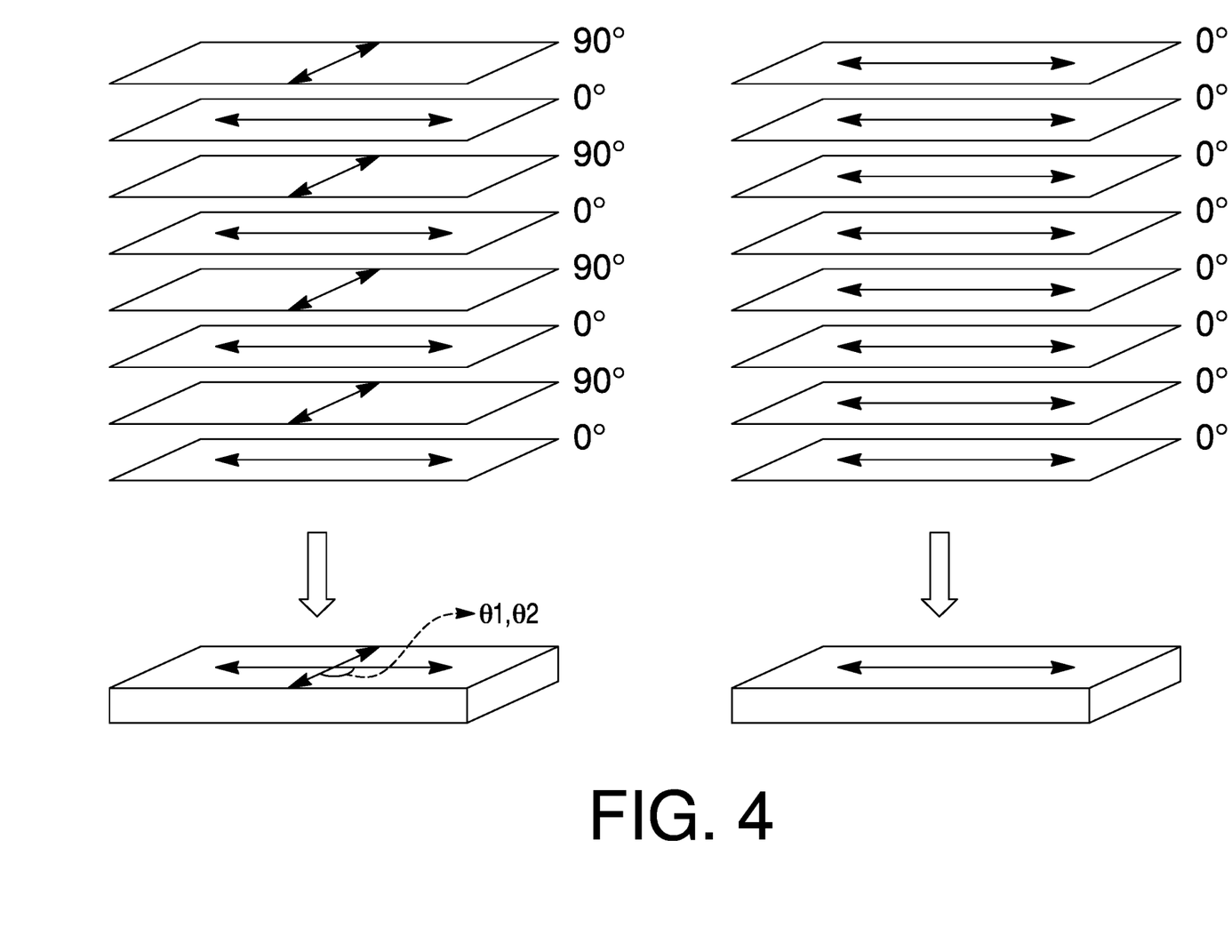
FIG. 4 illustrates laminates formed by stacking with different alignment angles being 0° or 90°. The higher thermal conductive direction of each anisotropic thermal conductive film and the laminates made thereof are represented by the black arrows.

Depending on the thickness of the first polymeric film, the base may be formed of a plurality of the first polymeric films by laminating, thermal forming, stitching, or combinations thereof, optionally applying an adhesive between the adjacent polymeric films. The first polymeric films may be stacked with an alignment angle $\theta 1$ ranging from 0° to 90° between the adjacent polymeric films respective to their higher TC directions as represented by the black arrows shown in FIG. 4. The alignment angle $\theta 1$ may be an integer between 0° to 90° such as 300, 45° or 60°, preferably, is 0° or 90° for the reasons of better overall TC performance and/or maximum usage of the TC films without waste. The resulting base may have higher in-plane thermal conductivity either in one direction (uni-direction) or in both the length and width directions.

Depending on the thickness of the second polymeric films, each fin may be formed of a plurality of the second polymeric films by laminating, thermal forming, stitching, or combinations thereof, and optionally an adhesive is applied between the adjacent polymeric thin films. The second polymeric films are stacked with an alignment angle $\theta 2$, ranging from 0° to 900 between the adjacent polymeric films respective to their higher TC directions. Preferably, the alignment angle $\theta 2$ is also 0° or 90° for the reasons mentioned above.

The First and Second Polymeric Films

It is known that polymers are known to have a thermal conductivity of less than 1 W/m·K. However, oriented polymeric fibers or films with high crystallinity and chain alignment tend to have higher thermal conductivities. Thermal energy in the polymer can be transported along the covalently bonded polymer chains and in case of oriented polymer, the thermal conductivity depends on many factors including crystallinity, molecular weight, and molecular weight distribution.

The first and second polymer films are manufactured in a way that the polymer chains are substantially aligned to obtain anisotropic thermal conductivity. These anisotropic thermal conductive films have a thermal conductivity in one direction higher than that of the orthogonal direction, and said higher thermal conductivity ranges from about 10 W/m·K to about 100 W/m·K, or from about 20 W/m·K to about 80 W/m·K, or from about 30 W/m·K to about 60 W/m·K.

Noted that many known anisotropic thermal conductive films may incorporate thermal conductive fillers such as graphite, boron nitride, and the like to enhance the in-plane thermal conductivity (up to 400 W/m·K). However, suitable anisotropic thermal conductive films to be used in the present heat sinks are free of fillers having a thermal conductivity of 5 W/m·K or more, so that the mechanical and electrical properties of the first polymeric film and the second polymeric film are not compromised. Examples of thermal conductive fillers include talc, alumina oxide, ZnO, $MgCO_3$, ZnS, CaO, MgO, ZnO, $TiO_2$; AN, BN, $MgSiN_2$, SiC, SiN; graphite, expanded graphite, ceramic-coated graphite, graphene, carbon fibers, carbon nanotubes (CNT), graphitized carbon black, carbon black, and fullerene.

Considering that the present heat sinks may have applications for electronic devices/components transmitting and receiving signals of high frequency and/or high speed, the first polymeric film and the second polymeric film preferably have excellent electrical properties including high resistivity and low signal loss. The first polymeric film and the second polymeric films each independently preferably has a resistivity of >$10^{15}$ Ω·cm. The first polymeric film and the second polymeric films each independently preferably has a dielectric constant (Dk) of 4 or less, or 3.2 or less, or 2.8 or less, or 2.5 or less at 10 GHz, or at 20 GHz, or at 30 GHz; and a dissipation factor (Df) of 0.001 or less, or 0.0005 or less, or 0.0003 or less at 10 GHz, or at 20 GHz, or at 30 GHz.

The oriented polymeric films may be manufactured by heating and stretching a precursor film along one direction (i.e. uni-directionally) several times with a stretch ratio of 5 to 100 or more. Alternative methods include extrusion, spin coating, injection-molding, solid state extrusion, electro-spinning and others. The polymer films formed as a result of the previous mentioned process have increased in-plane thermal conductivity in the stretched direction and generally become highly crystalline.

In some embodiments of the present heat sink, the first polymeric film and the second polymeric film each independently has a crystallinity of at least 75%, or at least 80%, or at least 85%, or at least 90%.

As the thermal energy is transported along the aligned polymer chains, the length of the molecular chain is preferably the longer the better. Therefore, the molecular weight the polymer suitable to form the anisotropic thermal conductive film is quite high, preferably having an average molecular weight at least 1,000,000 g/mole, or at least 2,000,000 g/mole; and having an average molecular weight no more than 20 million g/mole.

The first polymeric film and the second polymeric film suitable for used herein are each independently composed of a polymer selected from the group consisting of polyethylene (PE), polytetrafluoroethylene (PTFE), poly(p-phenylene benzobisoxazole) (PBO), polyhydroquinone-diimidazopyridine (PIPD), and poly(phenylene) benzobisthiazole (PBZT).

Considering manufacturing ease and raw material management, the first polymeric film and the second polymeric film are preferably the same. One skilled artisan can prepare an oriented polymeric film following well know literature methods or purchased from commercial sources. Commercially available sources generally provide the anisotropic TC polymeric material in form of fibers. An unidirectional laminate composed of the fibers may also be employed as first polymeric film and the second polymeric film. Examples of commercially available sources include, but not limit to, Dyneema® from DSM (i.e. UHMWPE fibers/UD laminate). Zylon® HM from TOYOBO (i.e. PBO fibers), and M5 AS from AkzoNobel (i.e. PIPD fibers).

In view of the commercial availability of anisotropic films, the first polymeric film and the second polymeric film are preferably composed of polyethylene having an average molecular weight at least 1,000,000 g/mole. Said polyethylene is also known as ultra-high molecular weight PE (UHMWPE). Suitable UHMWPE film has a thickness in the range of from about 10-360 m, or about 25-250 µm, or about 50-200 µm.

The thermal conductive PE films are commercially available from E.I. du Pont de Nemours and Company (U.S.A.) (hereafter referred as "DuPont") under the trade name of Temprion™ OHS with different thickness; and Endumax® film TA23 with a thickness of 55 µm from Teijin.

Method for Manufacturing the Heat Sink

As mentioned previously, the present invention also provides a method for manufacturing the present heat sink, comprising the following steps:

(i) providing a base and a plurality of fins; and
(ii) assembling the fins onto the base by laser soldering, gluing, inserting, stitching, or combinations thereof; wherein the base is composed of one or more first polymeric films;
the surface of the base is flat; uneven with a plurality of slots or slits, wherein each slot has a shape matching the connecting portion of the fin, or 3D shaped;
each fin is composed of one or more second polymeric films, and
the connecting portion of each fin is flat, wedged, curved, with flange, or a shape matching the 3D shaped base.

Noted that the fins are preferably arranged so that at least one of the higher TC directions of the fins is perpendicular to the base, i.e. along the vertical direction of the heat sink. However, the base may have one of the higher thermal conductive directions being either in the vertical direction or being in the horizontal direction of the heat sink.

One skilled artisan may easily design and make the present heat sink with the size, shape, and arrangement of the plurality of fins on the base that are suitably selected based on the locations and characteristics of the heat generating components of the electronic devices. For example, the 3D shaped base and the matching fins may be fabricated by thermal forming using molds. Generally, the increased surface area provided by the heat sink may also provide enhanced convective/radiative heat transfer into the ambient environment.

The heat sinks of the present invention overcome the intrinsic drawbacks of metallic heat sinks. Comparison to the heat sinks composed of thermal conductive filler containing polymers, the present heat sinks exhibit enhanced heat removal efficiency, with extremely flexibility in design.

Applications of the Heat Sink

As mentioned previously, the present invention further provides a method for dissipating heat of an electronic device, comprising:

(a) providing an electronic device having at least one heat generating component;
(b) placing the heat sink of the invention on the heat generating component, wherein the base is in contact with or near the heat generating component; and
(c) optionally, applying a thermal conductive adhesive or a heat resistant adhesive between the heat sink and the heat generating component.

The present heat sinks may be used in electronic devices as a passive heat exchanger, may act as a heat reservoir that absorbs an arbitrary amount of heat without significantly changing temperature. Heat dissipation from the present heat sink can be accomplished through convection or radiation, into an ambient or circulated air flow.

The electronic device may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device is not limited thereto, but may be any other electronic device processing data.

The electronic device generally may include chip related components, network related components, other components, and antenna modules, etc. Examples of the chip related components include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor (DSP), a cryptographic processor, a microprocessor, a microcontroller, or the like; and a logic chip such as an analog-to-digital (ADC) converter, an application-specific integrated circuit (ASIC), or the like. Among them, the present heat sinks are suitable for dissipating heat generated by the application processor chip includes, but not limited to, CPU, GPU, or DSP, since they are known to generate more heat compared to other electronic components.

Noted that both surfaces of the heat generating component and the heat sink can have non-planar interface surfaces, e.g., convex or concave. To ensure efficient cooling, a thin layer of a thermal conductive adhesive or a heat resistant adhesive may be applied between the heat sink and the heat generating component to fill the gap. The application of a thermal conductive adhesive or a heat resistant adhesive not only ensure efficient heat transmission, but also firmly attach the heat sink, thus the electronic device may be a mobile device.

Figure 8:
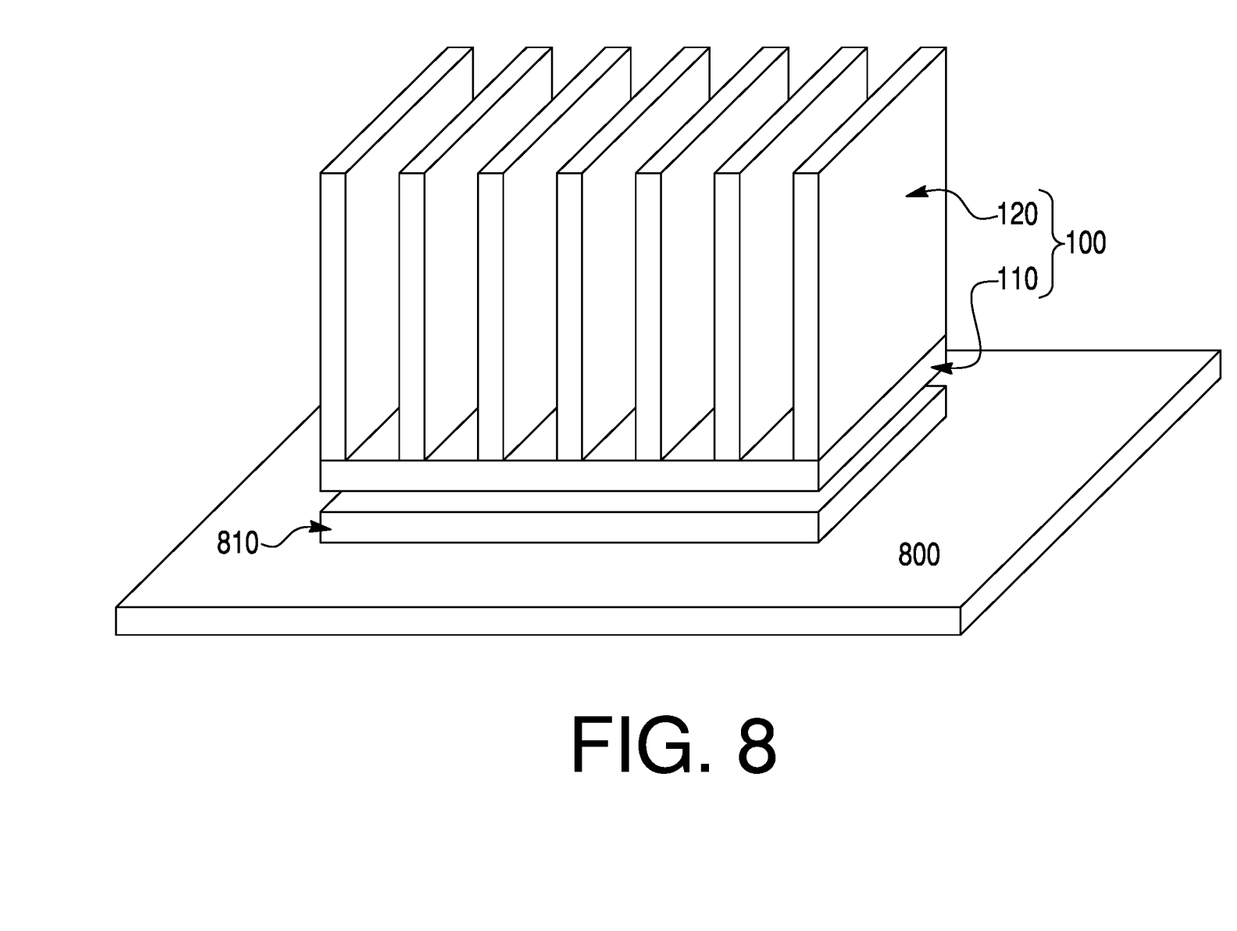
FIG. 8 is a perspective view showing one embodiment of the present method for heat dissipation of an electronic device.

Referring to FIG. 8, the present heat sink 100 is placed on top of a heat generating component 810 that is part of a PCB 800. The thermal conductive adhesive or the heat resistant adhesive may be applied to the interface between the base 110 and the generating component 810. The thermal conductive adhesive or the heat resistant adhesive in liquid form may be applied on the contacting surface of the base 110 or that of the heat generating component 810 by dispensing, stenciling, or spraying to form a thin layer with a thickness of up to 1.0 mm. The thermal conductive adhesive or the heat resistant adhesive may also be present in form of a film or a tape with or without a release film. One skilled in the art can use any common methods or tools to apply them with no difficulty.

As disclosed herein, the present invention also relates to electronic devices comprising the present heat sinks and obtained by the methods described above.

In one embodiment of the present electronic device, wherein the heat generating component is an application processor chip for a central processing unit (CPU), a digital signal processor (DSP), or a graphics processing unit (GPU).

In another embodiment of the present electronic device, wherein the heat generating component is not a light emitting diode (LED).

The following Examples and Comparative Examples are provided in order to set forth particular details of one or more embodiments. However, it will be understood that the embodiments of the present invention are not limited to the particular details described.

EXAMPLES

Material:
F1: an anisotropic TC film, available from DuPont under the trade name: TEMPRION™ OHS, has a film thickness of 60 μm, an in-plane thermal conductivity of 45 W/m·K (machine direction), 0.2 W/m·K (traverse direction), and a through-plane thermal conductivity of 0.2 W/m·K; at 10 GHz and 30 GHz, the Dk values are 2.3 and 2.2, and the Df values are 0.00023 and 0.00022, respectively.
F2: a 2-layered laminate of F1, the two films are stacked relative to their higher thermal conductive direction with an alignment angle of 90°, thus having an in-plane thermal conductivity of about 20 W/m·K in both of the machine and traverse directions.
F3: a multi-layered laminate of F1, prepared by stacking 4 or more layers of F1 with the alignment angle being 90° of any adjacent films. In other word, placing each film by alternating the higher thermal conductive direction being perpendicular to that of the previously laid film.
F4: a PET film with a thickness of 250 μm was purchased from Sunliky company, catalog no: NS2#250MPET.
F5: a PET film with a thickness of 50 μm was purchased from Sunliky company, catalog no: NS2#50MPET.
F6: a PE film containing 13 weight % of hexagonal boron nitride (h-BN) with a film thickness of 110 m. The PE film was prepared by blending the PE pellets (obtained from DOW, catalog number: XUS 61850.00) and h-BN particles (purchased from Dan Dong Institute of Chemical Engineering), then extruded to form h-BN containing pellets. The h-BN containing pellets were hot pressed at 140° C. to obtain an anisotropic TC film which has an in-plane TC of 2.36 W/m·K (non-directional) and a through plane TC of 0.30 W/m·K.
Adh1: a heat resistant acrylic adhesive, catalog. no.: ELG14010, purchased from Elegant Co. Adh2: a heat conductive adhesive with a thermal conductivity of 0.6 W/m·K, catalog. no.: TB8005, purchased from Elegant Co.

Preparation of Example 1

Figure 5:
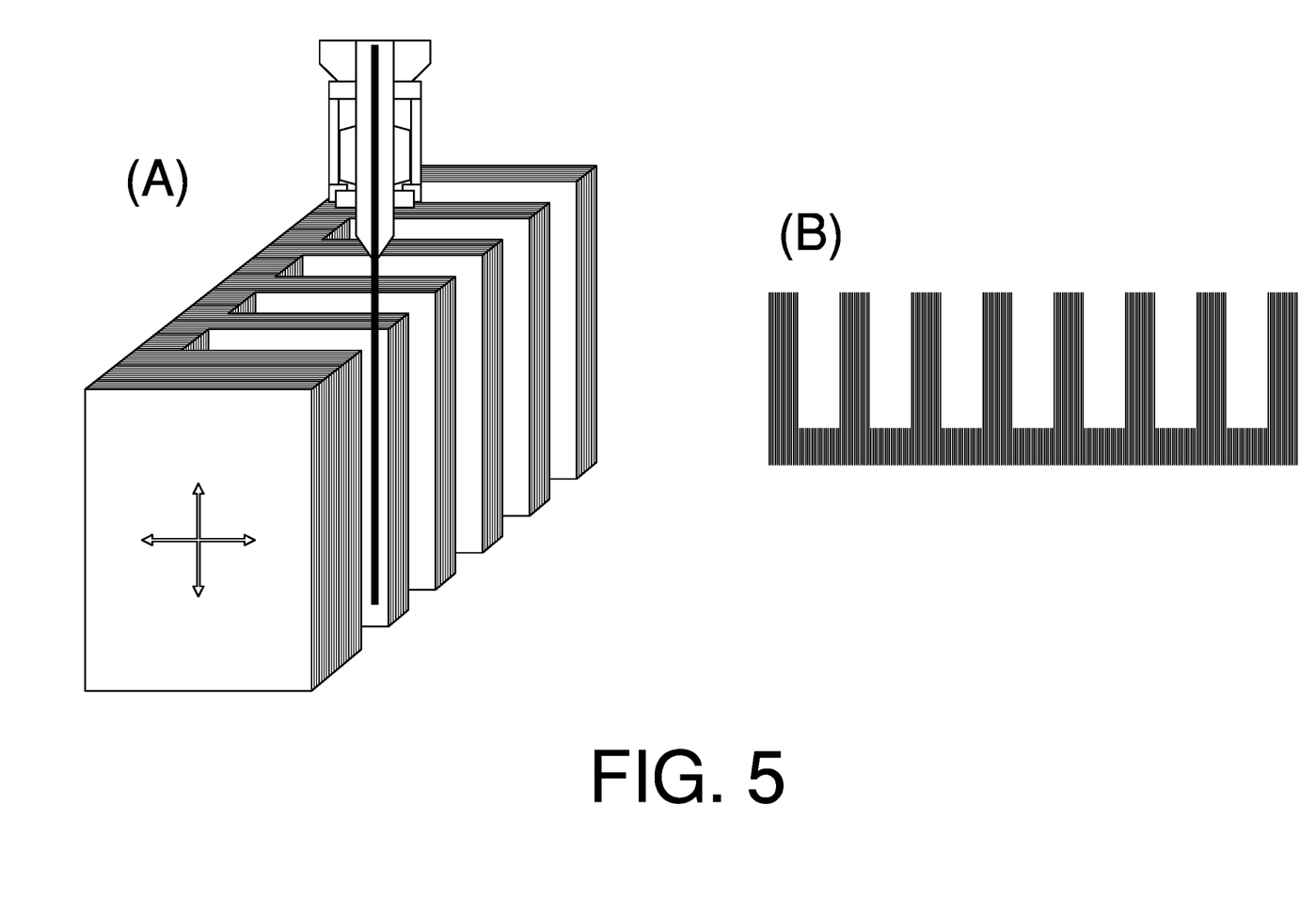

As illustrated in FIG. 5, a multi-layered laminate (F3) with the size of 20 mm (L1)×20 mm (W1)×7 mm (i.e. H1+H2) was cut by using a waterjet cutter to obtain a heat sink sample as one embodiment of the present invention. The sample had evenly spaced 12 fins and the distance between two fins was about 1.0 mm. Each fin had a width of 20 mm (W2), a height of 5 mm (H2), and a fin thickness (L2) of 0.6 mm. The base of the resulting heat sink sample had one of the higher TC directions aligned with the vertical direction of the heat sink sample.

Preparation of Example 2

Figure 6:
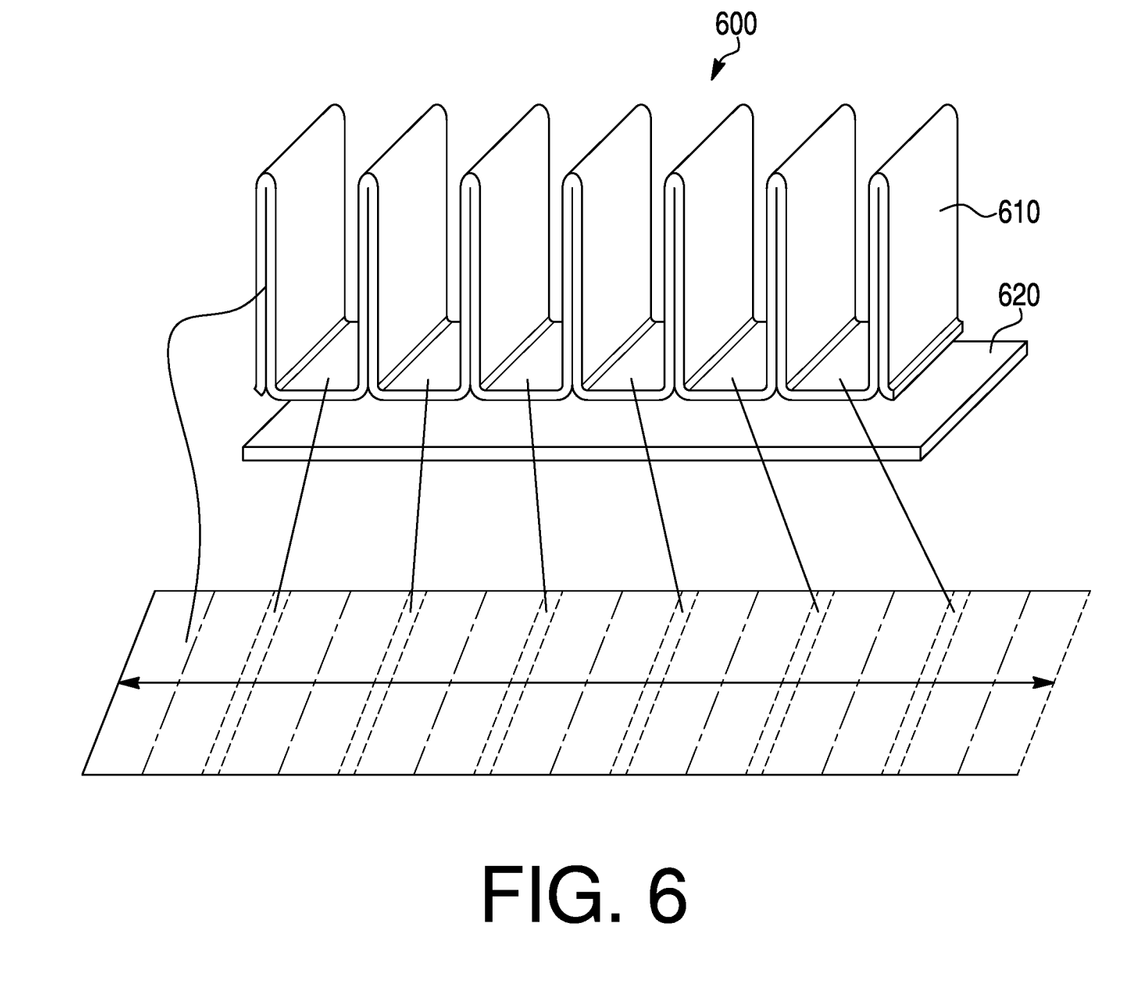
FIG. 6 illustrates some embodiments of the present invention that the fins in rectangular shape are formed by folding a strip of anisotropic thermal conductive film or laminates made thereof.

A multi-layered laminate (F3) with the size of 20 mm (L1)×20 mm (W1)×2 mm (H1) was used as the base, which had one of the higher thermal conductive directions being the vertical direction of the heat sink sample. As illustrated in FIG. 6, a rectangular strip of 2-layered laminate 610 (F2, size: 20 mm×120 mm) was folded to form 8 fins, then excess 2-layered laminate was cut. Each fin had a thickness (L2) of about 0.25 mm, height of 5 mm (H2), and a space of about 2.5 mm between fins. The piece of folded fins was adhered to the base 620 by applying a thin layer of the adhesive (adh1) to form a heat sink sample having a configuration as shown in FIG. 2(A), which is one embodiment of the present invention.

Preparation of Example 3

A multi-layered laminate (F3) with the size of 20 mm (L1)×20 mm (W1)×0.36 mm (H1) was used as the base, which had one of the higher thermal conductive directions being in the horizontal direction of the heat sink sample. Similar to the procedures described in Example 2, a rectangular strip of 2-layered laminate (F2) (size: 20 mm×120 mm) was folded to form 8 fins. Each fin had a thickness (L2) of about 0.25 mm, height of 5 mm (H2), and a space of about 2.5 mm between fins; then adhered to the base by applying a thin layer of the adhesive (adh1) and excess material was cut off to form a heat sink sample having a configuration as shown in FIG. 2(A), which is one embodiment of the present invention.

Preparation of Example 4

A multi-layered laminate (F3) with the size of 20 mm (L1)×20 mm (W1)×1 mm (H1) was used as the base, which had one of the higher thermal conductive directions being in the horizontal direction of the heat sink sample. Then the surface of the base was cut through by a knife to form eight slits with a length of 16 mm. A strip of a bi-layered laminate (F2) was cut to 8 rectangular fins; each fin had a thickness of 0.12 mm, a width of 16 mm and a height of 6 mm. The heat sink sample was assembled by inserting each fin to the slits on the base to form a heat sink sample having a configuration as shown in FIG. 2(E), which is as one embodiment of the present invention.

Preparation of Example 5

A multi-layered laminate (F3) with the size of 20 mm (L1)×20 mm (W1)×0.36 mm (H1) was used as the base, which had one of the higher thermal conductive directions being in the horizontal direction of the heat sink sample. The surface of the base was cut through by a knife to form 10 slits parallel to the width direction of the base. Each slit has a length of about 16 mm and a space of 2 mm between two slits. A rectangular piece of a single-layered film (F1, size:16 mm×200 mm) was inserted through the slits of the base from the bottom and the top alternatively and formed 5 loops as the fins (with a circumference of 36 mm each loop, estimated a height of ~17 mm). The heat sink sample had a configuration as shown in FIG. 2(F), which is as one embodiment of the present invention.

Preparation of Example 6

Figure 7:
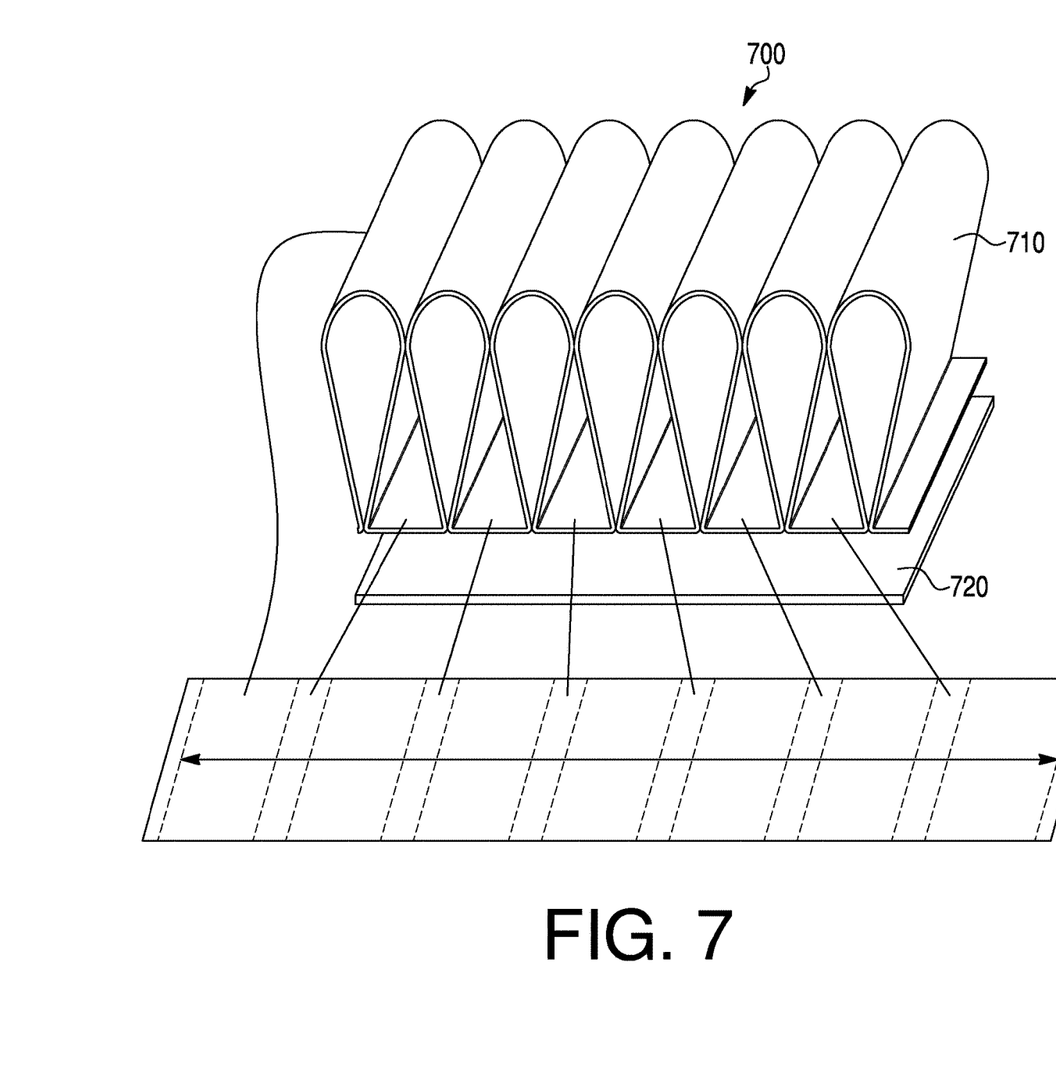
FIG. 7 illustrates some embodiments of the present invention that the loop-like fins are formed by folding a strip of anisotropic thermal conductive film or laminates made thereof.

As shown in FIG. 7, a rectangular piece of 2-layered laminate 710 (F2, size: 20 mm×380 mm) was folded to form 9 loops with a circumference of 40 mm each loop, about 2 mm of space between 2 loops, and 2 mm from the base edge; and then adhered to a piece of adhesive tape 720 with a release film to form a heat sink sample 700, as one embodiment of the present invention.

Preparation of Example 7

Similar to the procedures described in Example 2, a rectangular piece of 2-layered laminate (F2, size: 20 mm×380 mm) was folded to form 9 fins with a height of 20 mm (H2) and a thickness of 0.25 mm (L2), and a space of about 2 mm between fins; and then adhered to a piece of the adhesive tape with a release film to form a heat sink sample having a configuration as shown in FIG. 2(H), which is as one embodiment of the present invention.

Preparation of Example 8

Similar to the procedures described in Example 2, a rectangular piece of 2-layered laminate (F2, size: 20 mm×150 mm) was folded to form 9 fins with a height of 7 mm (H2) and a thickness of 0.25 mm (L2), and a space of about 2 mm between fins; and then adhered to a piece of the adhesive tape to form a heat sink sample having a configuration as shown in FIG. 2(H), which is as one embodiment of the present invention.

Preparation of Comparative Example 1 (CE1)

Similar to the procedures described in Example 6, a rectangular piece of a 50 µm PET film (F5, size: 20 mm W×200 mm L×0.05 mm H) was folded to form 5 loops with a circumference of 38 mm each loop as the fins 710. A 250 µm PET film (F4) with the size of 20 mm (L1)×20 mm (W1)×0.25 mm (H1) was used as the base 720. The loops were then adhered to the base by applying a piece of the adhesive tape to form a comparative heat sink sample (as shown in FIG. 7).

Preparation of Comparative Example 2 (CE2)

A heat sink made of aluminum by casting was purchased from Dongguan Haolong hardware products and used as a comparative example. The aluminum heat sink had a base of 20 mm (W1)×20 mm (L1)×2 mm (H1), and 8 evenly spaced fins. Each fin had a size of 20 mm (W2)×1 mm (L2)×5 mm (H2).

Preparation of Comparative Example 3 (CE3)

Similar to the procedures described in Example 8, a piece of rectangular film (F6, size: 20 mm×150 mm) was folded to form 9 fins with a height of 7 mm (H2) and a thickness of 0.22 mm (L2), and a space of about 2 mm between fins, and then adhered to a piece of the adhesive tape to form a heat sink sample having a configuration as shown in FIG. 2(H) as a comparative sample.

Figure 9:
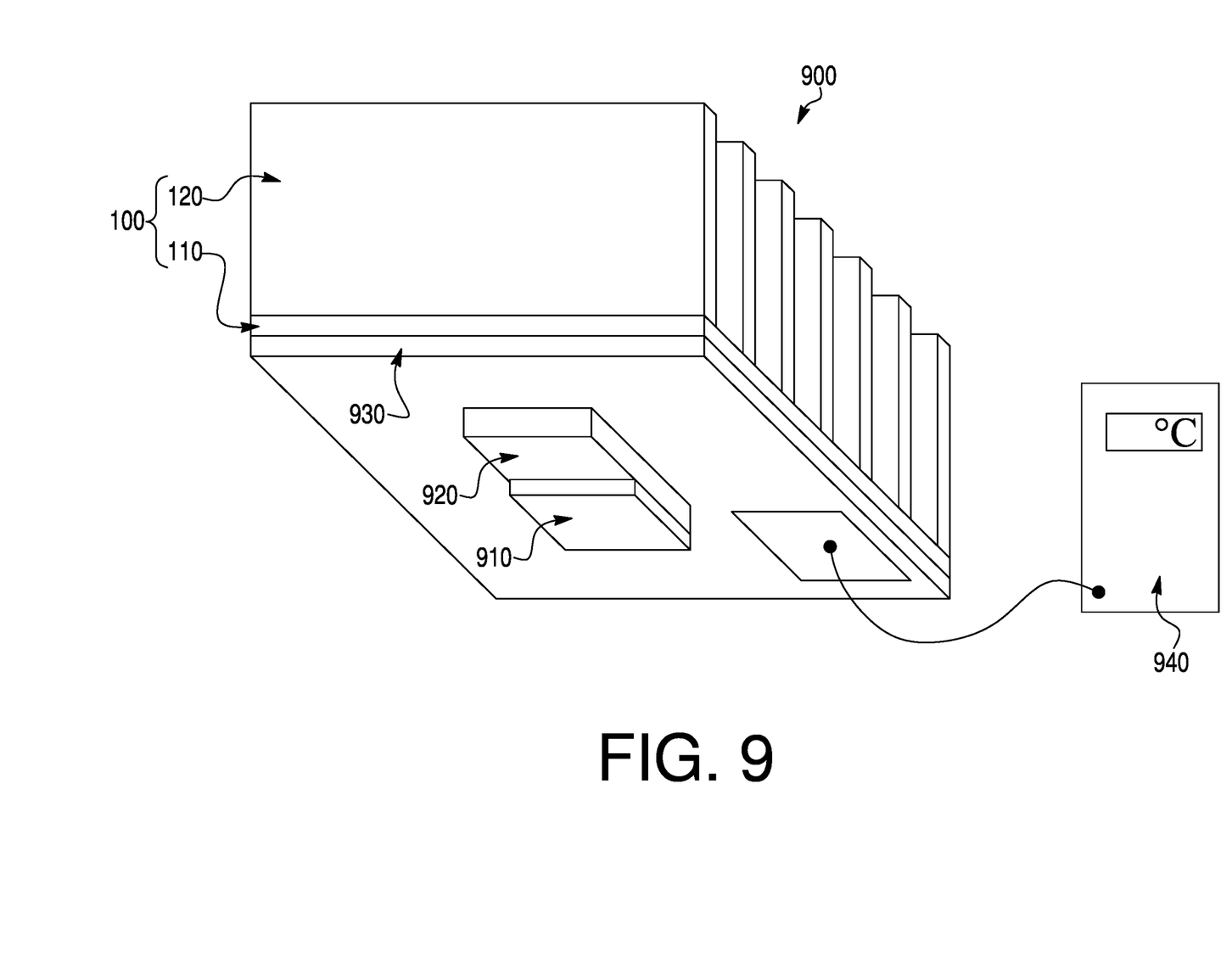
FIG. 9 is a perspective view showing the heat resistor assembly for testing the thermal removal performance of each heat sink sample.

Testing Methods:

The heat dissipation performance evaluations were carried out by using a heating resistor assembly 900 as shown in FIG. 9. A heating resistor 910 (8.5 mm×10 mm×4.5 mm, model: TO220 35 W, manufactured by Xinlong Electronics with an adjustable DC power source (not shown in FIG. 9) (catalog no. 30V5A, DP3005ET, manufactured by MESTEK)) and a stainless-steel heat spreader 920 (10 mm×13 mm×1 mm) were used to mimic working power chips. The heating resistor assembly (910 and 920) was adhered to a thin aluminum plate 930 (20 mm×20 mm×0.8 mm) by a heat conductive adhesive (adh2), with a thermal conductivity of 0.6 W/m·K. The thermal couple 940 was taped on the backside of the thin aluminum plate 930 to measure the aluminum plate's temperature.

The heating resistor 910 had the power set at 4 Watts and heated for about 10 min, so the aluminum plate 930 reached a steady temperature for 5 min as measured by the thermal couple 940. When there was no sample placed on top of the aluminum plate, the steady temperature reading was recorded as $T_1$, which was used as the reference temperature. A heat sink sample 100 was then placed on top of the heated aluminum plate as shown in FIG. 9 to allow heat dissipating through the heat sink sample until the temperature reading was steady for 5 min and recorded as $T_2$. The heat removal performance is judged by the difference between $T_1$ and $T_2$ ($\Delta T$), and the data are listed in Table 1. The greater degree of cooling, the better heat removal performance.

Volume Resistivity ($\Omega \cdot cm$): the volume resistivity of each material (10 cm×10 cm by size) used to make the heat sink was measured by using a Keithley 6517A Electrometer/High resistance meter according to the ASTM D257 method. The measured data were listed in Table 1. The volume resistivity of aluminum was taken from public information.

It's evident from the data in Table 1, the present heat sink samples of E1-E8 made of polymeric film free of thermal conductive filers demonstrated excellent heat removal performance with a degree of cooling ranging from −11° C. to −28° C.

Comparison between E6 versus CE1, both heat sink samples were constructed the same way, similar fin height (~19 mm vs. ~18 mm), the sample of E6 showed a heat removal performance of −25° C. that is superior than that of CE1 (i.e. +° C.). Noted that the sample of CE1 has more fins than that of E6, thus, more total surface area for heat dissipation. Because the sample of CE1 is composed of PET film containing no TC fillers, it is expected to have poor heat removal performance.

Comparison between E8 versus CE3, both heat sink samples having the same configuration, fin number, fin height, and only slightly different in the fin thickness, the sample of E8 showed a heat removal performance of −17° C. that is much better than that of CE3 (i.e. −3° C.). Noted that the sample of CE3 is composed of a polyethylene containing 13 weight % of h-BN. Although one may increase the content of the TC fillers in a polymeric film/matric to increase the heat removal performance, the heat sink made from said high TC fillers containing material are expected to have deteriorated mechanic properties and undesired high Dk/Df values.

Furthermore, the heat sink samples of E1, E2, E6 and E7 surprisingly showed heat removal performance near to that of the alumina heat sink sample of CE2 (−31° C.). The results suggest that the present heat sinks composed of anisotropic thermal conductive films may provide excellent thermal removal performance similar to that of the metallic heat sinks through optimized design (e.g., fin number, fin height, and configuration). Not to mention that the present heat sinks also possess excellent electronic properties such as high resistivity, low Dk and Df values, and light weighted, therefore, that make them well suitable for use in electronic devices for high frequency and/or highspeed applications.

wherein
- the base has a length (L1) ranging from 5 mm to 300 mm, a width (W1) ranging from 5 mm to 300 mm, and a thickness (H1) ranging from 0.03 mm to 200 mm;
- each fin has a thickness (L2) of 2.0 mm or less, a width (W2) ranging from 0.5 to 2.0 times that of W1, and a protruding height (H2) of at least 3 mm;
- the average number of fins is in a range of from 0.5 to 10 per 10 mm of the base's length;
- the base is composed of one or more first polymeric films;
- each fin is composed of one or more second polymeric films; and
- the first polymeric films and the second polymeric films are anisotropic thermal conductive films, each independently has a volume resistivity of more than $10^{15}$ $\Omega \cdot cm$; an in-plane thermal conductivity in one direction higher than that of the orthogonal direction, and said higher thermal conductivity ranges from 10 to 100 W/m·K; a dielectric constant of 4 or less at 30 GHz; and a dissipation factor of 0.001 or less at 30 GHz;
- provided that the first polymeric films and the second polymeric films are free of fillers having a thermal conductivity of 5 W/m·K or more.

2. The heat sink of claim 1, wherein the first polymeric film and the second polymeric film each independently has a crystallinity of at least 75%.

3. The heat sink of claim 1, wherein the first polymeric film and the second polymeric film are each independently composed of a polymer having an average molecular weight being at least 1,000,000 g/mole.

4. The heat sink of claim 1, wherein the first polymeric film and the second polymeric film are each independently

TABLE 1

|  | E1 | E2 | E3 | E4 | E5 | E6 | E7 | E8 | CE1 | CE2 | CE3 |
|---|---|---|---|---|---|---|---|---|---|---|---|
| Base, material | F3 | F3 | F3 | F3 | F3 | F2 | F2 | F2 | F4 | A1 | F6 |
| L1, mm | 20 | 20 | 20 | 20 | 20 | 20 | 20 | 20 | 20 | 20 | 20 |
| W1, mm | 20 | 20 | 20 | 20 | 20 | 20 | 20 | 20 | 20 | 20 | 20 |
| H1, mm | 2.00 | 2.00 | 0.36 | 1.00 | 0.36 | 0.12 | 0.12 | 0.12 | 0.25 | 2.00 | 0.11 |
| Higher TC direction of the base | vertical | vertical | horizontal | horizontal | horizontal | horizontal | horizontal | horizontal | Isotropic | Isotropic | horizontal |
| Fin, material | F3 | F2 | F2 | F2 | F1 | F2 | F2 | F2 | F5 | A1 | F6 |
| L2, mm | 0.60 | 0.25 | 0.25 | 0.25 | 0.06 | 0.25 | 0.25 | 0.25 | 0.05 | 1.00 | 0.22 |
| W2, mm | 20 | 20 | 20 | 16 | 16 | 20 | 20 | 20 | 20 | 20 | 20 |
| H2, mm | 5 | 5 | 5 | 5 | ~17 | ~19 | 20 | 7 | ~18 | 7 | 7 |
| Fin, number | 12 | 8 | 8 | 8 | 10 | 9 | 9 | 9 | 10 | 8 | 9 |
| Higher TC direction of the fins | vertical | vertical | vertical | vertical | vertical | vertical | vertical | vertical | Isotropic | Isotropic | vertical |
| Volume Resistivity[a] ($\Omega \cdot cm$) | $>10^{15}$ | $>10^{15}$ | $>10^{15}$ | $>10^{15}$ | $>10^{15}$ | $>10^{15}$ | $>10^{15}$ | $>10^{15}$ | $>10^{15}$ | $2.6 \times 10^{-6}$ | $>10^{15}$ |
| Heat sink configuration[b] | FIG.5 | FIG.2(A) | FIG.2(A) | FIG.2(E) | FIG.2(F) | FIG.7 | FIG.2(H) | FIG.2(H) | FIG.7 | FIG.5 | FIG.2(H) |
| $T_1$, ° C. | 134 | 137 | 136 | 137 | 137 | 122 | 123 | 121 | 137 | 136 | 120 |
| $T_2$, ° C. | 108 | 112 | 123 | 126 | 125 | 97 | 95 | 104 | 138 | 105 | 117 |
| $\Delta T$ ($T_2-T_1$), ° C. | −26 | −25 | −13 | −11 | −12 | −25 | −28 | −17 | +1 | −31 | −3 |

[a]the volume resistivity listed here are mesaured of the material(s) used in the example or comparative example except for CE2.
[b]the heat sink configuration of the example is referred to a figure number. Noted that the dimension and fins number of the heat sink sample may be different from the illustration.

What is claimed is:

1. A heat sink for an electronic device, comprising a base and a plurality of fins protruding from one surface of the base, composed of a polymer selected from the group consisting of polyethylene, polytetrafluoroethylene, poly(p-phenylene benzobisoxazole), polyhydroquinone-diimidazopyridine, and poly(phenylene benzobisthiazole).

5. The heat sink of claim 1, wherein the first polymeric film and the second polymeric film are the same.

6. The heat sink of claim 1, wherein the fins and the base are separated parts and assembled together by laser soldering, gluing, inserting, stitching, or combinations thereof.

7. The heat sink of claim 1, wherein the surface of the base is flat; uneven with a plurality of slots or slits, wherein each slot has a shape matching the connecting portion of the fin; or 3D shaped.

8. The heat sink of claim 1, wherein a portion of each fin is connected to the base; and is flat, wedged, curved, with flange, or a shape matching the 3D shaped base.

9. The heat sink of claim 1, wherein each fin is a sheet of square, rectangle, circle, oval, hexagon, or irregular shape.

10. The heat sink of claim 1, wherein each fin is a thin board composed of multiple cells with a cross-sectional shape of triangle, square, rectangle, circle, or hexagon.

11. The heat sink of claim 1, wherein the fins are interconnected into a block with multiple air pathways; each air pathway has a cross-sectional shape of triangle, square, rectangle, circle, or hexagon.

12. The heat sink of claim 1, wherein the base is formed of a plurality of the first polymeric films by laminating, thermal forming, stitching, or combinations thereof; and optionally applying an adhesive between the adjacent polymeric films.

13. The heat sink of claim 12, wherein the first polymeric films are stacked with an alignment angle θ1 ranging from 0° to 90° between the adjacent polymeric films relative to the respective higher thermal conductive directions.

14. The heat sink of claim 1, wherein each fin is formed of a plurality of the second polymeric films by laminating, thermal forming, stitching, or combinations thereof; and optionally applying an adhesive between the adjacent polymeric films.

15. The heat sink of claim 14, wherein the second polymeric films are stacked with an alignment angle θ2, ranging from 0° to 90° between the adjacent polymeric films relative to the respective higher thermal conductive directions.

16. A method for manufacturing the heat sink of claim 1, comprising:
  (i) providing a base and a plurality of fins; and
  (ii) assembling the fins onto the base by laser soldering, gluing, inserting, stitching, or combinations thereof;
  wherein
  the base is composed of one or more first polymeric films;
  the surface of the base is flat; uneven with a plurality of slots or slits, wherein each slot has a shape matching the connecting portion of the fin; or 3D shaped;
  each fin is composed of one or more second polymeric films; and
  the connecting portion of each fin is flat, wedged, curved, with flange, or a shape matching the 3D shaped base.

17. A method for dissipating heat of an electronic device, comprising:
  (a) providing an electronic device having at least one heat generating component;
  (b) placing the heat sink of claim 1 on the heat generating component, wherein the base of the heat sink is in contact with or near the heat generating component; and
  (c) optionally, applying a thermal conductive adhesive or a heat resistant adhesive between the base and the heat generating component.

18. An electronic device, comprising: at least one heat generating component, the heat sink of claim 1, and optionally a thermal conductive adhesive or a heat resistant adhesive, wherein the heat sink is placed on the heat generating component, the base of the heat sink is in contact with or near the heat generating component, and the thermal conductive adhesive or a heat resistant adhesive if present is situated between the base and the heat generating component.

19. The electronic device of claim 18, wherein the heat generating component is an application processor chip for central processing unit, a digital signal processor, or a graphics processing unit.

20. The electronic device of claim 18, wherein the heat generating component is not a light emitting diode.

* * * * *